United States Patent [19]
Fujihira et al.

[11] Patent Number: 5,097,302
[45] Date of Patent: Mar. 17, 1992

[54] SEMICONDUCTOR DEVICE HAVING CURRENT DETECTION CAPABILITY

[75] Inventors: Tatsuhiko Fujihira; Takeyoshi Nishimura, both of Matsumoto, Japan

[73] Assignee: Fuji Electric Co., Ltd., Japan

[21] Appl. No.: 672,381

[22] Filed: Mar. 20, 1991

[30] Foreign Application Priority Data

Mar. 20, 1990 [JP] Japan .................................. 2-71397

[51] Int. Cl.$^5$ ...................... H01L 29/10; H01L 27/02; H02H 3/18; H02H 9/02
[52] U.S. Cl. .................................... 357/23.4; 357/41; 357/46; 357/51; 361/87; 361/93
[58] Field of Search ..................... 357/23.4, 41, 46, 51; 361/87, 93

[56] References Cited
U.S. PATENT DOCUMENTS 4,783,690 11/1988 Walden et al. ..................... 357/23.4

Primary Examiner—Mark Prenty
Attorney, Agent, or Firm—Brumbaugh, Graves, Donohue & Raymond

[57] ABSTRACT

In a power MOS-type semiconductor device with a current detection terminal, a first number of main MOSFET elements are connected to one another in parallel, and a second number of detection MOSFET elements are similarly connected to one another. First and second terminals of the main and detection MOSFET elements are commonly connected. A third terminal of one of the detection MOSFET element is used as the current detection terminal. The current or voltage measured at this detection terminal is substantially proportional to the ratio of the first number to the second number. To this end, the parasitic resistance in the device is increased so as to inhibit a leak current from flowing therethrough. Moreover, the ON resistance of each of the detection MOSFET elements is designed to be lower than that of a main MOSFET element by an amount which is a function of the first number and the detection resistance connected to the current detection terminal.

20 Claims, 4 Drawing Sheets

SEMICONDUCTOR DEVICE HAVING CURRENT DETECTION CAPABILITY

TECHNICAL FIELD

The present invention relates to a semiconductor device which may be applicable to power integrated circuit (IC) or other devices employing, for example, power metal-oxide-semiconductor-field-effect transistors (MOSFET), insulated-gate-bipolar transistors (IGBT) or both, and more particularly, to a MOS-type semiconductor device having a capability of measuring a load current therein.

BACKGROUND OF THE INVENTION

FIG. 4 shows n-channel power MOS-type semiconductor device 1 with a current detection terminal of conventional design. Device 1 is known as a feeding switch and has a structure which prevents a breakdown due to an overcurrent. Such a device has two types of cells (elements or unit structures) whose numbers are in a proportion of m to n. Specifically, these cells are detection cells $Q_{SE}$ and main cells $Q_O$ connected in parallel. Cells $Q_{SE}$ and $Q_O$ each may be a MOSFET with common drain terminal D and common gate terminal G. Source terminal S of main cell $Q_O$ is electrically connected, through external detection resistance $R_{SE}$, to detection terminal SENSE which is also the source terminal of cell $Q_{SE}$. Detection resistance $R_{SE}$ need not be realized as a resistor exterior to device 1, but may be an internal resistance in the form of diffusion or polysilicon resistance in device 1. The structures of MOSFET cells $Q_{SE}$ and $Q_O$, including their channel lengths and widths, are substantially identical. The numbers of detection cells $Q_{SE}$ and main cells $Q_O$ are hereinafter referred to as $N_{SE}$ and $N_O$, respectively. As mentioned before, these numbers are in a proportion of m to n. That is, $$N_{SE}:N_O = m:n, \quad (1)$$

where m<n.

It is desirable to have a MOS-type semiconductor device with a current detection terminal, in which the detection current flowing through the detection resistance is proportional to the ratio m:n of the respective numbers of the detection cells and the main cells.

SUMMARY OF THE INVENTION

In accordance with the present invention, a parasitic resistance in a semiconductor device with a current detection terminal is increased so as to inhibit a leak current flowing therethrough. As a result, the effect of the parasitic resistance is virtually eliminated. Advantageously, the detection current or voltage measured at the current detection terminal is substantially proportional to the respective numbers of the detection cells and the main cells.

Moreover, the ON resistance of each of the detection cells is reduced, with respect to a main cell, by an amount which is a function of the number of the detection cells in the device and the detection resistance connected to the current detection terminal. Consequently, the effect of the detection resistance is essentially eliminated. Advantageously, the detection current or voltage is, again, substantially proportional to the ratio of the respective numbers of the detection cells and the main cells.

| Explanation of numerals: | |
|---|---|
| (1) | N-channel power MOS-type semiconductor device with a current detection terminal |
| (2) | n+ -type substrate |
| (3) | n− -type epitaxial layer |
| (4) | Deep p-well |
| (6, 16a) | Gate insulation films |
| (7, 7', 7'') | Gate electrodes |
| (8) | Shallow p-well |
| (9) | n+ -type source layer |
| (10, 10') | interlayer insulation films |
| (11) | Common source electrode |
| (12) | Detection electrode |
| (13) | Common drain electrode |
| (16, 16') | Insulation films |
| (16b, 16b') | Thick insulation films |
| $Q_o$ | Main cell |
| $Q_{SE}$ | Detection cell |
| $R_{SE}$ | Detection resistance |
| $I_{SE}$ | Detection current |
| $V_{SE}$ | Detection voltage |

DETAILED DESCRIPTION

Figure 5:
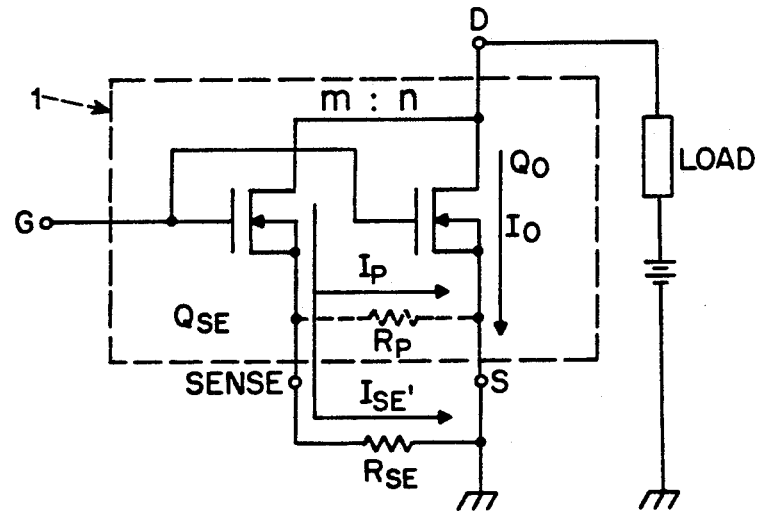
FIG. 5 is a diagram of a circuit equivalent to a conventional n-channel power MOS-type semiconductor device with a current detection terminal.

Preferred embodiments described below may be appreciated in view of the following further discussion with reference to FIGS. 5-7.

Figure 6:
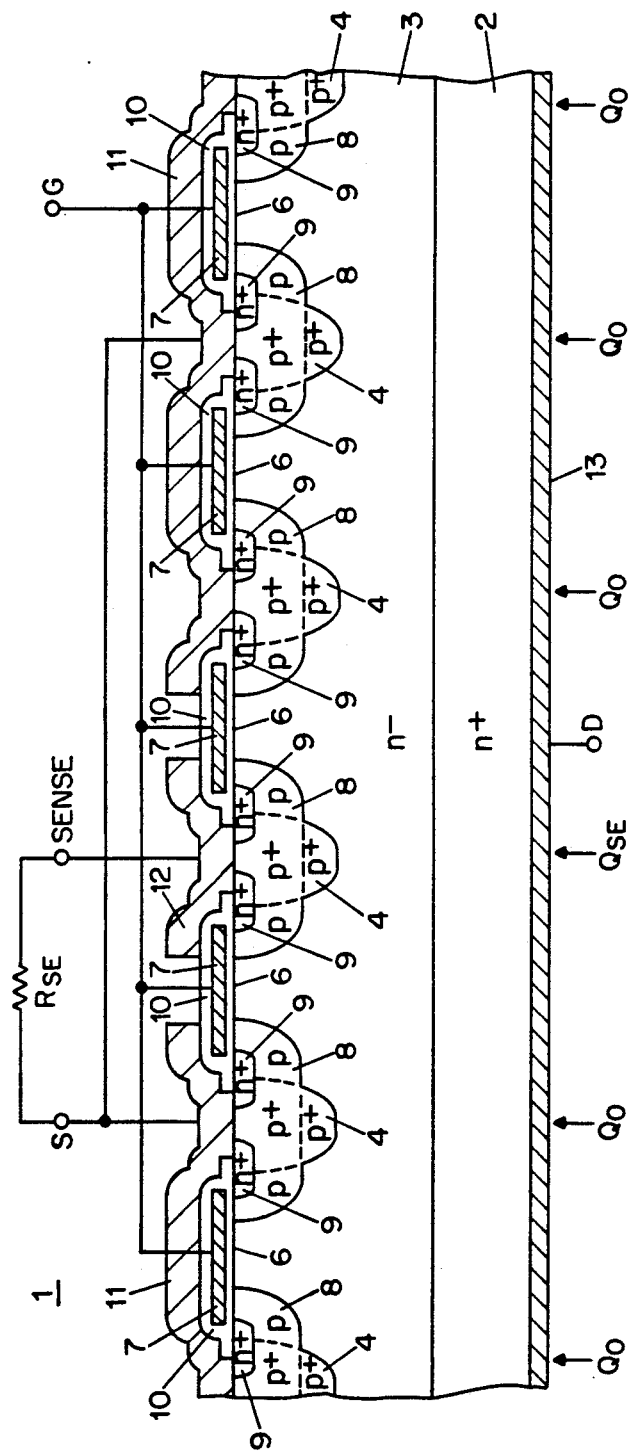
FIG. 6 is a vertical cross-section of the structure of a conventional power MOS-type semiconductor device with a current detection terminal.
Figure 7:
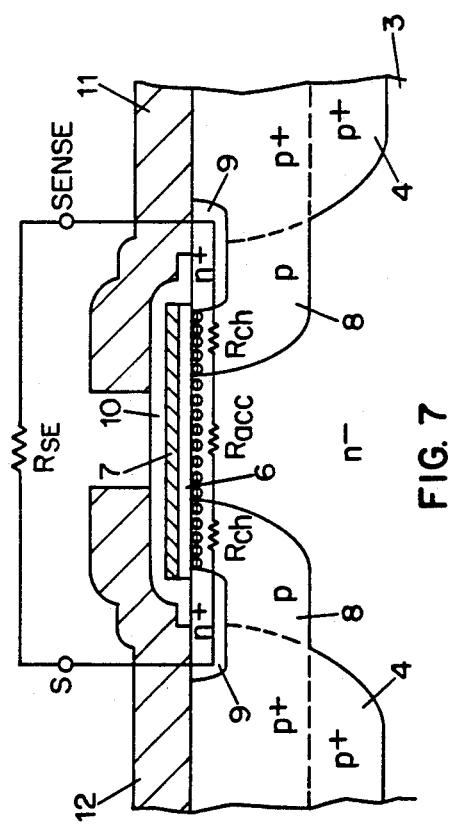
FIG. 7 is an enlarged cross-section of an area in which a main cell adjoins a detection cell in the device of FIG. 6

FIG. 6 shows the structure of power MOS-type semiconductor device 1 with the current detection terminal. Device 1 is fabricated by a process in which n−-type epitaxial layer 3 is laminated on n+-type substrate 2. Deep p-wells 4 are formed on the surface of n−-type expitaxial layer 3 by photolithographic and boron ion implantation processes, followed by high-temperature treatment. Concomitant to this high temperature treatment, a thick oxide film is formed on the surface of expitaxial layer 3 due to thermal oxidation. The oxide film is removed from the chip except its circumference by another photolithographic process. The remaining oxide film on the chip circumference (not shown) is needed to entrench the chip for sustaining a high voltage applied thereto. In addition, gate oxide film 6 is formed by thermal oxidation, and polysilicon is deposited onto the chip by a CVD process, followed by a diffusion of phosphorus. Gate electrodes 7 are formed by removing all unnecessary remainder in a photolithographic process. With electrodes 7 as individual masks, shallow p-wells 8 are superimposed onto deep p-wells 4 by a boron implantation process and heat treatment. Thereafter, n+-type source layers 9 are formed by photolithographic and phosphorus ion implantation processes. After inter-layer insulation films 10, which are made of phosphoric glass, have been deposited through a CVD process, windows are opened for electrode connections using a photolithographic process. Subsequent to a deposition of Al-Si onto the device, it is patterned by a photolithographic process to form source electrodes 11 and detection electrode 12. Metal deposition is thereupon carried out on the back of the device to form common drain electrode 13. Although the above-described process is applied, in particular, to the fabrication of an n-channel MOS-type device, this process can also be applied to the fabrication of a similar IGBT-type device, except that n+-type substrate 2 is replaced by a substrate of p+-type.

In device 1, when a sufficient positive voltage is applied to a gate electrode 7, electrons on the surface of the shallow p-well 8 directly beneath gate electrode 7 are excited, thereby forming a channel inversion layer. As a result, a conductive path is formed from the n+-type source layer 9 to n−-type epitaxial layer 3 through the channel inversion layer. In addition, a current flows from drain electrode 13 to detection electrode 12 through source electrode 11. At this point, because the MOSFET cell connected to detection electrode 12 is substantially identical to a MOSFET cell connected to source electrode 11, the proportion of the amount of current $I_O$ flowing through the source electrode to the amount of current $I_{SE}$ flowing through the detection electrode is expected to be same as the proportion of the respective numbers of the cells connected to them. That is, $$I_{SE} = (m/n) I_O. \quad (2)$$

It is important to note that in this case detection resistance $R_{SE}$ is selected at a sufficiently small value. Accordingly, the detection voltage $V_{SE}$ can be obtained by the following formula:

$$V_{SE} = R_{SE} (m/n) I_O, \quad (3)$$

or $$I_O = n (V_{SE}/m) R_{SE}. \quad (4)$$

That is, the value of current $I_O$ is a product of the measured detection voltage $V_{SE}$ and a constant.

Nevertheless, in practice $I_O$ is not accurately reflected by expression (4). FIG. 7 is an enlarged cross-section of part of FIG. 6 in which a main cell $Q_O$ adjoins a detection cell $Q_{SE}$. When a positive voltage is applied to gate electrode 7, electrons in shallow p-wells 8 which are directly beneath gate electrode 7 are excited. Simultaneously, electrons are accumulated in n−-type epitaxial layer 3 directly beneath gate electrode 7 in a high concentration. As a result, source layer 9 of detection cell $Q_{SE}$ is connected to source layer 9 of main cell $Q_O$ through parasitic resistance $R_P$, which is the sum of $R_{CH}$, $R_{ACC}$ and, again, $R_{CH}$, where $R_{CH}$ denotes the channel resistance and $R_{ACC}$ denotes the accumulation layer resistance. It should be pointed out that parasitic resistance $R_P$ is less than detection resistance $R_{SE}$. FIG. 5 is a circuit diagram taking into consideration parasitic resistance $R_P$.

In device 1 with the current detection terminal having the above-described structure, parasitic resistance $R_P$ exists internally between source electrode 11 and detection electrode 12, and a leak current flows through this parasitic resistance. This being so, current $I'_{SE}$ flowing through detection resistance $R_{SE}$ in this instance is less than current $I_{SE}$ in formula (2).

Furthermore, disregarding the parasitic resistance for a moment and assuming that the ON resistance of cells $Q_{SE}$ and $Q_O$, when turned on, are $R_{QSE}$ and $R_{QO}$, respectively, one expects that:

$$R_{QSE}/R_{QO} = n/m, \quad (5)$$

since all the cells are structurally equivalent. Nevertheless, in practice, detection resistance $R_{SE}$ is non-zero in value and performs a current limiting function. As such, $$(R_{QSE} + R_{SE})/R_{QO} > n/m \quad (6)$$

and $$I'_{SE} < (n/m) I_O. \quad (7)$$

Thus, in a prior-art device, the value of current $I_O$ is actually not proportional to the ratio of the respective numbers of the cells.

In a preferred MOS-type semiconductor device with a current detection terminal, a multiplicity of main cells have common source electrodes electrically connected to source layers. One or more detection cells in this device have detection electrodes electrically connected to the source electrodes thereof. Each cell has a vertical MOS structure with a gate electrode formed on a gate insulation film above a semiconductor substrate of a first conductivity type. Semiconductor wells of a second conductivity type are formed on the surface of the semiconductor substrate by a double diffusion process using gate electrodes as individual masks. The source layers are within these well and are of the first conductivity type. In addition, the gate electrodes are electrically connected to one another.

Figure 1:
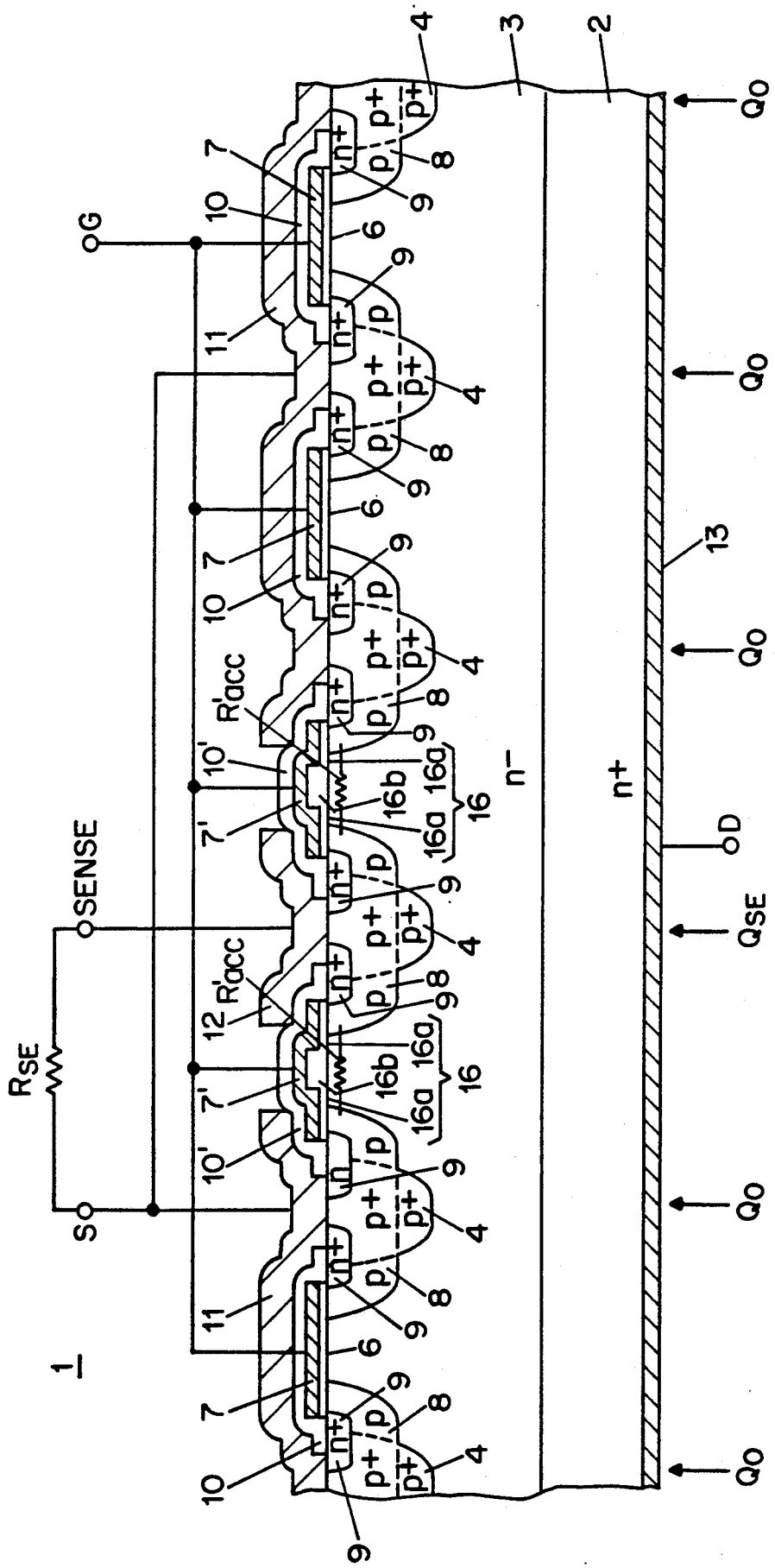
FIG. 1 shows a vertical cross-section of the structure of a MOS-type semiconductor device with a current detection terminal in a first embodiment of the invention.

FIG. 1 shows a vertical cross-section of the structure of a MOS-type semiconductor device with a current detection terminal in a first embodiment of the present invention. The description for the parts in FIG. 1 represented by the same numerals as in FIG. 6 are not repeated here.

As shown in FIG. 1, each insulation film 16 lies above and between two p-wells 4 of, respectively, a detection cell $Q_{SE}$ and an adjoining main cell $Q_O$. Gate insulation film 16a within insulation film 16 are as thick as gate insulation film 6. Also within insulation film 16 is insulation film 16b which is formed on n−-type epitaxial layer 3 between the two p-wells. However, insulation film 16b is designed, in accordance with the invention, to be thicker than film 16a or film 6. Each gate electrode 7' is formed on insulation film 16, and an inter-layer insulation film 10' is formed on top of gate electrode 7'.

The following describes, in sequence, the processes involved in the fabrication of the MOS-type device up to the formation of insulation film 16. In a well-known manner, n—-type epitaxial layer 3 is laminated on n+-type substrate 2. Deep p-wells 4 are formed on the surface of layer 3 by photolithographic and boron ion injection processes, followed by high temperature treatment. Again, concomitant to this high temperature treatment, a thick oxide film is formed on the surface of layer 3 due to thermal oxidation. This film is removed from the chip except its circumference by the photolithographic process, thus leaving insulation film 16b. Since the subsequent processes are well-known in the art, the details of these processes, thus, need not be dwelled upon here.

When a positive voltage is applied to gate electrodes 7 and gate electrodes 7', a channel inversion layer is formed, and detection cells $Q_{SE}$ and main cells $Q_O$ are turned on. At this point, the resistance $R_{CH}$ of the channel beneath gate insulation film 16a would be same as in the usual case. However, the density of the charges accumulated on the surface of n—-type epitaxial layer 3 is, in this instance, less than that in the usual case. This stems from the existence of relatively thick insulation film 16b lying between detection cell $Q_{SE}$ and adjoining main cell $Q_O$. As a result, the accumulated resistance $R'_{ACC}$ is greater than the accumulated resistance $R_{ACC}$ in a prior art case where the insulation films have a uniform thickness. Thus, in this instance $$R'_{ACC} > R_{ACC}. \tag{8}$$

This being so, the parasitic resistance $R'_P$ in the present case is greater than the parasitic resistance $R_P$ in the prior art case. That is, in this instance $$R'_P > R_P. \tag{9}$$

Figure 3:
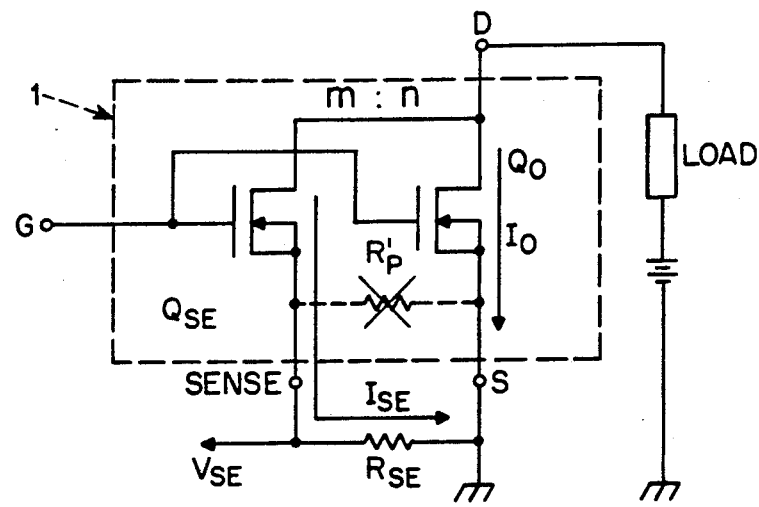
FIG. 3 is a diagram of a circuit equivalent to the semiconductor devices of the first and second embodiments.
Figure 4:
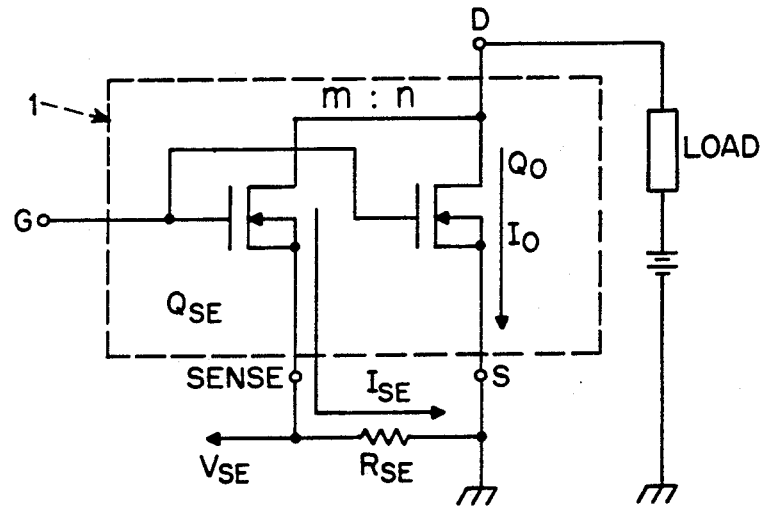
FIG. 4 is a diagram of a circuit equivalent to an ideal n-channel power MOSFET with a current detection terminal.

It should be noted at this juncture that the parasitic resistance $R'_P$ increases with the thickness of insulation film 16b. Thus, when insulation film 16b is made sufficiently thick, the parasitic resistance $R'_P$ is high enough to be disregarded as shown in FIG. 3. In the case as depicted by FIG. 3, because the leak current flowing through parasitic resistance $R'_P$ is minute, the current flowing through detection cell $Q_{SE}$ is virtually as much as that flowing through detection resistance $R_{SE}$. As such, the detection voltage is proportional to the ratio of the respective numbers of the detection cells and the main cells, provided that the resistance $R_{SE}$ is sufficiently small as explained hereinbefore.

Figure 2:
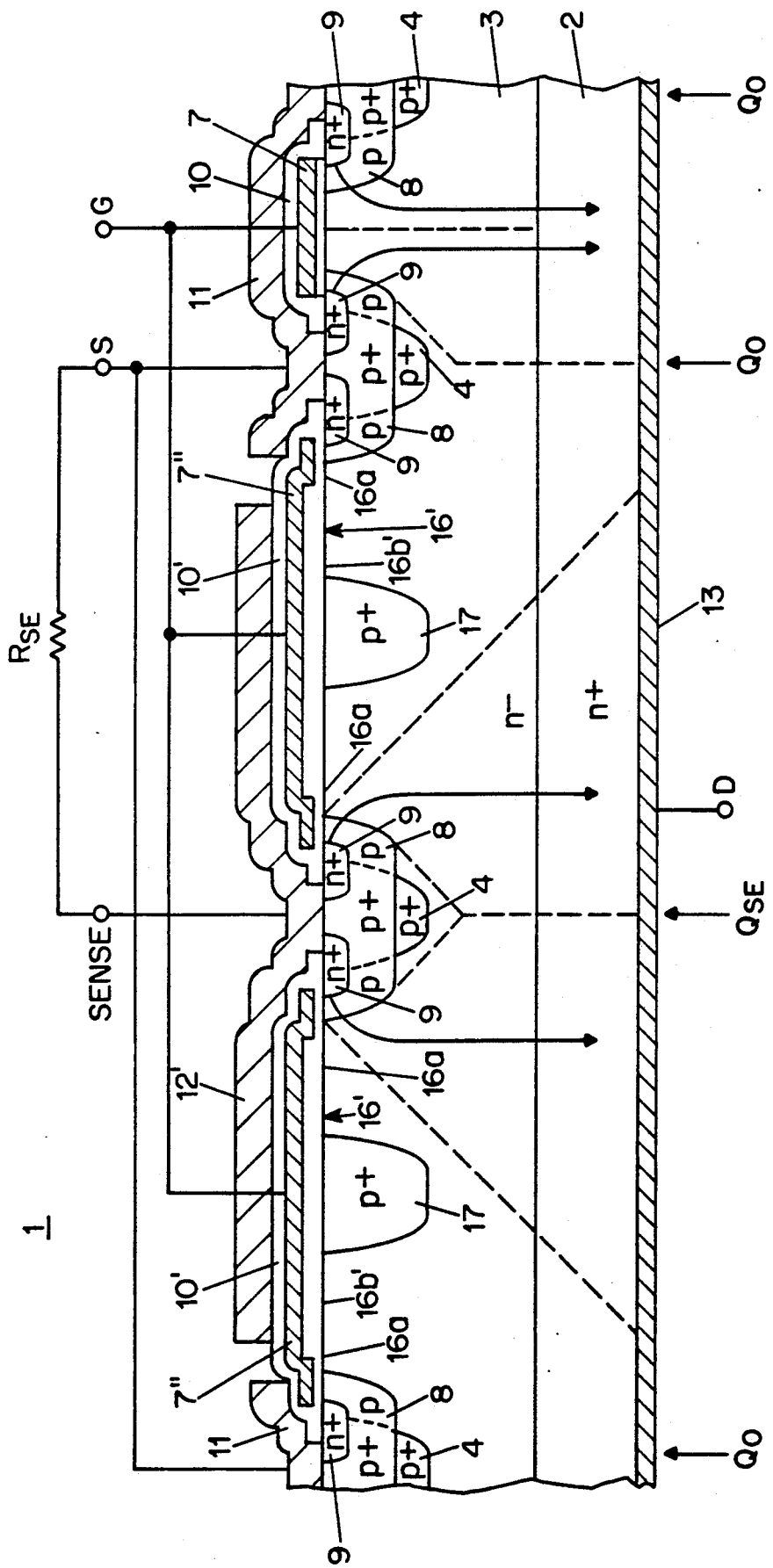
FIG. 2 shows a vertical cross-section of the structure of another MOS-type semiconductor device with a current detection terminal in a second embodiment of the invention.

Turning now to a second embodiment of the present invention, FIG. 2 shows the vertical cross-section of the structure of another MOS-type semiconductor device 1 with a current detection terminal. The description for the parts in FIG. 2 represented by the same numerals as in FIG. 6 are not repeated here. In this embodiment, p+-type stopper region 17 is formed, in accordance with the invention, on the surface of n—-type epitaxial layer 3 and lies between two deep p-wells 4 of, respectively, a detection cell $Q_{SE}$ and an adjoining main cell $Q_O$. Stopper region 17 is formed at the same time as the deep p-wells. In accordance with another feature of the invention, the interdistance of deep p-wells 4 in this illustrative embodiment is made greater than the first embodiment. Moreover, the thickness of gate insulation films 16a within insulation film 16' is same as that of insulation film 7 of a main cell $Q_O$. Nevertheless, insulation film 16b' between insulation films 16a is thicker than the latter. In addition, detection cell $Q_{SE}$ occupies a larger cross-sectional area and a wider current path than a main cell $Q_O$. This being so, the resistivity of main cell $Q_O$ is higher than that of detection cell $Q_{SE}$.

As in the first embodiment, the parasitic resistance in this instance is relatively high, stemming from the existence of relatively thick insulation film 16b'. Nevertheless, in this embodiment the density of the charges accumulated on the surface of stopper region 17 is almost zero. Moreover, due to the relatively long distance between detection cell $Q_{SE}$ and an adjoining deep p-well 4, the parasitic resistance is overwhelmingly great, with respect to the prior art case. As such, the parasitic resistance can be disregarded and the leak current can be ignored.

The drain current paths of detection cell $Q_{SE}$ and main cells $Q_O$ are defined by broken lines in FIG. 2. Since detection cell $Q_{SE}$ occupies a greater cross-sectional area than main cell $Q_O$, the drain current path of cell $Q_{SE}$ is broader than that of cell $Q_O$. This being so, the ON resistance of detection cells $Q_{SE}$ is lower than that of main cells $Q_O$ in this particular embodiment.

To be exact, detection resistance $R_{SE}$ is non-zero. Thus, in accordance with still another feature of the invention, the ON resistance of each detection cell $Q_{SE}$ is manipulated to be lower than that of a main cell $Q_O$ by an amount of, for example, $mR_{SE}$, if the number of detection cells $Q_{SE}$ in device 1 is m. With this feature in place, it can be shown that the current limiting effect of resistance $R_{SE}$ is eliminated, based on the fact that resistance $R_{SE}$ is equivalent to the resistance of m parallel connected resistors each having a value $mR_{SE}$. This being so, the amount of the detection current is virtually proportional to the ratio of the respective numbers of the detection cells and the main cells in device 1.

In sum, the present invention is directed to different techniques for achieving the proportionality of the detection current or voltage to the ratio of the respective numbers of the detection cells and the main cells. Central to the majority of these techniques is to increase the parasitic resistance, which exists in the device between a main cell on a semiconductor substrate of a first conductivity type and an adjoining semiconductor well of a second conductivity type.

Specifically, in accordance with a first technique, the insulation film between a detection cell and an adjoining main cell is made thicker than the gate insulation film on its either end. As a result, the density of the charges accumulated beneath this thicker insulation film is relatively low. As such, the parasitic resistance between the source of the detection cell and that of the main cell increases, thereby effectively deterring the leak current from flowing therethrough. Consequently, the detection voltage is substantially proportional to the ratio of the respective numbers of the detection cells and the main cells.

In accordance with a second technique, a stopper region is formed on the semiconductor substrate of the first conductivity type and lies between a detection cell and an adjoining main cell. The stopper region significantly increases the accumulated resistance on the substrate surface. Accordingly, the parasitic resistance is significantly increased and a substantial reduction of the leak current is realized.

In accordance with a third technique, the distance between a detection cell and an adjoining main cell is increased. As a result, the path for the current to flow through the parasitic resistance is accordingly lengthened. This increases the total parasitic resistance and thereby reduces the amount of the leak current.

In accordance with the final, fourth technique, the ON resistance of each detection cell is manipulated to be equal to the ON resistance of a main cell less a multiple of the detection resistance. As a result, the detection current is, again, substantially proportional to the ratio of the respective numbers of the detection cells and the main cells.

The foregoing merely illustrates the principles of the invention and it is appreciated that those skilled in the art will be able to devise numerous arrangements which, although not explicitly shown or described herein, embody the principles of the invention.

We claim:

1. In a semiconductor device, a first number of first switching elements connected to one another in parallel, and a second number of second switching elements connected to one another in parallel, each of said first switching elements and said second switching elements comprising a terminal, said terminal of a particular one of said first switching elements being electrically connected to said terminal of a particular one of said second switching elements through a first resistance, a second, parasitic resistance being in parallel to said first resistance, said semiconductor device comprising:
   means for sensing a voltage across said first resistance; and
   means for inhibiting a current from flowing through said second resistance, so that said voltage is substantially proportional to the ratio of said first number to said second number.

2. The semiconductor device of claim 1 wherein each of said first switching elements is a metal-oxide-semiconductor-field-effect transistor (MOSFET).

3. The semiconductor device of claim 1 wherein each of said first switching elements is an insulated-gate-bipolar transistor (IGBT).

4. The semiconductor device of claim 1 wherein each of said second switching elements is a MOSFET.

5. The semiconductor device of claim 1 wherein each of said second switching elements is an IGBT.

6. The semiconductor device of claim 1 wherein each of said first switching elements and said second switching elements is structurally identical.

7. The semiconductor device of claim 1 wherein said inhibiting means comprises an insulation film whose thickness is so selected that said second resistance is substantially increased.

8. The semiconductor device of claim 1 wherein said inhibiting means comprises a stopper region for preventing said current from flowing through said second resistance.

9. The semiconductor device of claim 1 wherein said inhibiting means is effected by setting the particular first switching element and the particular second switching element so far apart that said second resistance is substantially increased.

10. The semiconductor device of claim 1 wherein each of said first switching elements and said second switching elements has a second terminal and a third terminal, second terminals of said first switching elements and said second switching elements being commonly connected to one another, and third terminals of said first switching elements and said switching elements being also commonly connected to one another.

11. In a semiconductor device, a first number of first switching elements connected to one another in parallel, a second number of second switching elements connected to one another in parallel, each of said first switching elements and said second switching elements comprising a terminal, said terminal of a particular one of said first switching elements and said terminal of a particular one of said second switching elements being electrically connected through a predetermined resistance, said semiconductor device comprising:
   means for sensing a voltage across said predetermined resistance; and
   means for turning on said first switching elements and said second switching elements, each of said first switching elements and each of said second switching elements, when turned on, having a first resistance and a second resistance, respectively, said first resistance being lower than said second resistance by an amount which is a function of said first number and said predetermined resistance.

12. The semiconductor device of claim 11 wherein said amount is a product of said first number and said predetermined resistance.

13. The semiconductor device of claim 11 wherein each of said first switching elements is a MOSFET.

14. The semiconductor device of claim 11 wherein each of said second switching elements is an IGBT.

15. The semiconductor device of claim 11 wherein each of said second switching elements is a MOSFET.

16. The semiconductor device of claim 11 wherein each of said first switching elements and said second switching elements has a second terminal and a third terminal, second terminals of said first switching elements and said second switching elements being commonly connected to one another, and third terminals of said first switching elements and said second switching elements being also commonly connected to one another.

17. In a semiconductor device, a first number of first switching elements connected to one another in parallel, and a second number of second switching elements connected to one another in parallel, each of said first switching elements and said second switching elements comprising a terminal, said terminal of a particular one of said first switching elements being electrically connected to said terminal of a particular one of said second switching elements through a predetermined resistance, a second, parasitic resistance being in parallel to said predetermined resistance, said semiconductor device comprising:
   means for turning on said first switching elements and said second switching elements, each of said first switching elements and each of said second switching elements, when turned on, having a third resistance and a fourth resistance, respectively, said third resistance being lower than said fourth resistance by an amount which is a function of said first number and said predetermined resistance;
   means for sensing a voltage across said predetermined resistance; and
   means for inhibiting a current from flowing through said second resistance, so that said voltage is substantially proportional to the ratio of said first number to said second number.

18. The semiconductor device of claim 17 wherein said inhibiting means comprises an insulation film whose thickness is so selected that said second resistance is substantially increased.

19. The semiconductor device of claim 17 wherein said inhibiting means comprises a stopper region for preventing said current from flowing through said second resistance.

20. The semiconductor device of claim 17 wherein said inhibiting means is effected by setting the particular first switching element and the particular second switching element so far apart that said second resistance is substantially increasing.

* * * * *

UNITED STATES PATENT AND TRADEMARK OFFICE
CERTIFICATE OF CORRECTION

PATENT NO. : 5,097,302
DATED : March 17, 1992
INVENTOR(S) : Fujihira et al.

It is certified that error appears in the above-identified patent and that said Letters Patent is hereby corrected as shown below:

Column 7, line 60, "said switching" should read --said second switching--;

Column 8, line 67, "increasing" should read --increased--.

Signed and Sealed this

Seventeenth Day of August, 1993

Attest:

BRUCE LEHMAN

Attesting Officer

Commissioner of Patents and Trademarks